United States Patent
Biber et al.

(10) Patent No.: US 8,587,312 B2
(45) Date of Patent: Nov. 19, 2013

(54) PATIENT BED, LOCAL COIL ARRANGEMENT AND METHOD TO DETERMINE THE POSITION OF LOCAL COILS IN A MAGNETIC RESONANCE APPARATUS

(75) Inventors: Stephan Biber, Erlangen (DE); Carl Udo Maier, Stuttgart (DE); Jochen Ostermaier, Erlangen (DE); Kay Uwe Seemann, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 746 days.

(21) Appl. No.: 12/764,280

(22) Filed: Apr. 21, 2010

(65) Prior Publication Data

US 2010/0272229 A1    Oct. 28, 2010

(30) Foreign Application Priority Data

Apr. 21, 2009 (DE) .......................... 10 2009 018 282

(51) Int. Cl.
*G01V 3/00* (2006.01)
(52) U.S. Cl.
USPC .......................................... 324/318; 324/322

(58) Field of Classification Search
USPC ........................... 324/300–322; 600/407–445
See application file for complete search history.

(56) References Cited

U.S. PATENT DOCUMENTS

| | | | |
|---|---|---|---|
| 5,794,621 A | 8/1998 | Hogan et al. | |
| 5,984,930 A * | 11/1999 | Maciunas et al. | 606/130 |
| 7,570,056 B2 * | 8/2009 | Nakabayashi et al. | 324/318 |
| 7,729,741 B2 * | 6/2010 | Meaney et al. | 600/415 |
| 7,835,778 B2 * | 11/2010 | Foley et al. | 600/407 |
| 7,844,318 B2 * | 11/2010 | Rezzonico et al. | 600/410 |
| 8,212,558 B2 * | 7/2012 | Mueller | 324/307 |
| 8,391,957 B2 * | 3/2013 | Carlson et al. | 600/429 |
| 2007/0035301 A1 | 2/2007 | Nakabayashi et al. | |
| 2010/0052682 A1 | 3/2010 | Mueller | |
| 2011/0060216 A1 * | 3/2011 | Foley et al. | 600/426 |
| 2012/0126814 A1 * | 5/2012 | Fischer et al. | 324/318 |
| 2012/0209293 A1 * | 8/2012 | Carlson et al. | 606/130 |

* cited by examiner

*Primary Examiner* — Brij Shrivastav
(74) *Attorney, Agent, or Firm* — Schiff Hardin LLP

(57) ABSTRACT

At least one non-stationary coil in a magnetic resonance tomography system is attached with a fastener to a displaceable bed. The fastener has a position detector incorporated therein to determine the position or a component of the position of the non-stationary coil. The portion of the position is, for example, the position along the axis of symmetry of the measurement tube.

15 Claims, 2 Drawing Sheets

Proximity Sensor

Proximity Sensor

PATIENT BED, LOCAL COIL ARRANGEMENT AND METHOD TO DETERMINE THE POSITION OF LOCAL COILS IN A MAGNETIC RESONANCE APPARATUS

BACKGROUND OF THE INVENTION

1. Field of the Invention

The present invention concerns methods and devices to determine or detect the position of local coils in a magnetic resonance tomography system.

2. Description of the Prior Art

In addition to stationary acquisition coils (for example shoulder array coils), non-stationary acquisition coils (for example body matrix coils) are also used in magnetic resonance (MR) tomography. During the measurement, the measurement coils are moved into the isocenter of the measurement tube. For this purpose, the position of the tube (primarily along the axis of symmetry of the measurement tube) is determined by sighting with a laser cross-hair. It is disadvantageous that such a sighting is error-prone and time-consuming under the circumstances.

SUMMARY OF THE INVENTION

An object of the present invention is to provide a design and a method that allow an improved position determination of non-stationary coils in an MR system. In particular the aforementioned disadvantages should be avoided.

In a bed table according to the invention for a magnetic resonance tomography system, at least one of its side edges is designed for the attachment of fasteners for coils for use in the magnetic resonance tomography system. Furthermore, a position detector determines the position of one or more fasteners on the side edge. The position is thereby advantageously detected along one axis (the extent of the side edge).

For example, fixing belts can be attached to the bed table according to the invention, which fixing belts in turn themselves position the coil or coils on the body of the patient. The position of the fixing belt (and therefore of the coil) is then determined at least along the extent of the side edge using the fastening point on the side edge.

In contrast to manually determining the position by means of a laser cross-hair, the bed table according to the invention thus itself incorporates position determination components themselves. This avoids involvement of an operator/technician prior to the use of the magnetic resonance tomography system, which increases the security with regard to operating errors and the speed of the measurement process. The laser cross-hair (which can be quite uncomfortable for a patient) can also be omitted.

In an embodiment that makes use of radio-technology for identification of the position, the arrangement according to the invention exhibits the advantage of being more precise and insensitive to reflections than multiple path propagation. This can be achieved by a cable-connected or fiber-connected position determination component that itself is embodied in the fastener.

Furthermore, compared to position determination by means of a laser cross-hair, the invention exhibits the advantage that subsequent position changes of the coil that, for example, are due to movements of the patient, can be measured and taken into account. Coverage of the patient (for example with a blanket for warming) is possible without any problems without hindering the position determination.

It is particularly advantageous for the bed table according to the invention to be used together with a coil arrangement according to the invention. The coil arrangement according to the invention for a magnetic resonance tomography system has at least one coil for use in the magnetic resonance tomography system as well as at least one fastener by means of which the coil arrangement can be fastened on a bed table for the magnetic resonance tomography system at a fastening point, and the coil can be aligned on the body of a patient. The fastener furthermore includes a position detector to determine the position of the coil relative to the fastening point along at least one spatial direction.

In contrast to the simple fixing belts, the coil arrangement thus itself comprises possibilities to determine the alignment and the location of the coil relative to a base of the coil arrangement at which the fastening occurs on the bed table. The alignment and the position can thereby be determinable along one spatial direction—for example along the axis that is provided by the side edge of the bed table—or in all spatial directions.

The combination of the two elements according to the invention at a bed table system allows the position of the coil with regard to the bed table to be determined from the position of the fastening point of the fastening means at the bed table and the position of the coil relative to the fastening point. Depending on the design of the coil arrangement, the position can thereby also be determined in three dimensions, which is not possible or is only possible with difficulty with unmodified fixing belts.

Optical or capacitive proximity switches or electrical or mechanical contact sensors (for example) are considered for the position detector of one or more fasteners at the side edge.

The coil arrangement can include a combination of pivot bearings and/or ball-and-socket bearings for positioning the coil, which bearings enable the alignment of (for example) telescoping devices. An exemplary combination composed of three pivot bearings and three rods (of which at least two are variable in length in the manner of a telescope) allows a nearly free positioning of the coil over the bed table.

The elements of the coil arrangement are advantageously formed of materials that do not magnetically interact. For example, plastics, glass measuring sticks and optical fibers can be used. It is likewise appropriate to accommodate possibly necessary electronic components outside of the measurement space, for example in the base of the coil arrangement that, upon fastening on the bed table, remains in the area of its side edge.

The position detector in the coil arrangement can include at least one optical sensor and at least one optical waveguide. With optical sensors it can be most easily ensured that no magnetic interaction occurs, and thus also no mutual interferences of position determination and magnetic resonance measurement are to be expected.

In the method according to the invention to determine the position of a coil in a magnetic resonance tomography system in relation to a bed table for the magnetic resonance tomography system, the coil is placed on the body of a patient and fastened on the bed table by a fastener; the position of the fastening point of the fastener at the bed table is determined; the position of the coil relative to the fastening point is determined; and from this the position of the coil is determined in relation to the bed table.

DESCRIPTION OF THE PREFERRED EMBODIMENTS

Figure 1:
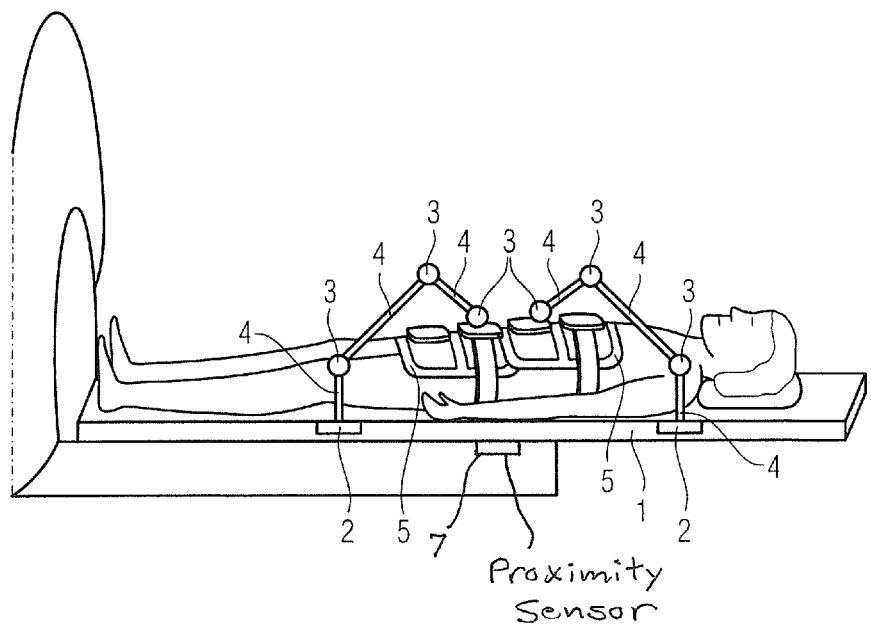
FIG. 1 shows a design for position determination of non-stationary coils by means of telescoping fastenings.

FIG. 1 shows a person who lies on the bed table 1 of an MR system. Two coils, what are known as body matrix coils 5, are placed on his body. The coils 5 are fastened on respective telescoping arm systems and are positioned by the telescoping arm systems. Each telescoping arm system in this exemplary embodiment has three ball-and-socket joints 3. At least some of the ball-and-socket joints 3 can be replaced by revolute joints. The ball-and-socket joints 3 are connected with one another by means of telescoping rods 4. The connection made up of telescoping rods 4 and the ball-and-socket joints 3 allows the corresponding coil 5 to be very flexibly placed in three dimensions on the body of the patient to be examined.

In this exemplary embodiment the position of the coil 5 is now determined. Instead of occurring via a manual sighting by means of a laser cross-hair, this occurs via multiple additional elements in the telescoping arm system. In this exemplary embodiment the fastening of the telescoping arm on the bed table ensues flexibly via a contact point 2 whose location is variable. The base of the telescoping arm system is attached at the contact point and is therefore anchored. A sensor technology (for example via proximity sensors 7 in the bed table 1 itself) allows the location of the contact point to be established. The position of the base of the telescoping arm system is thus known.

Figure 3:
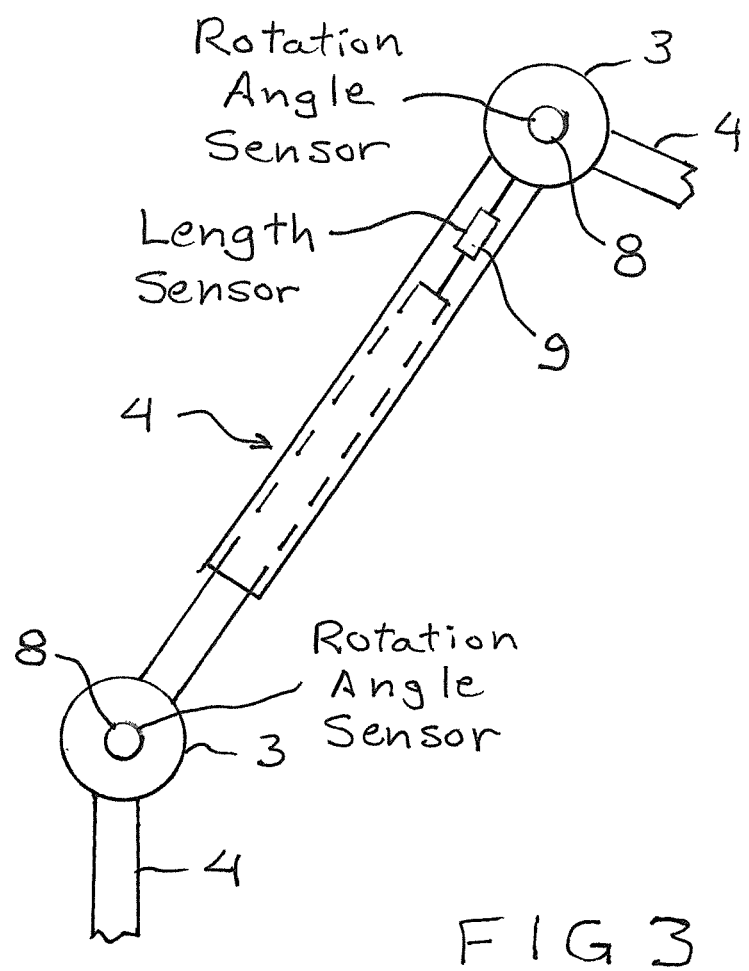
FIG. 3 schematically illustrates sensors embodied in the telescoping fastenings shown in the embodiment of FIG. 1.

Additional sensors are housed in the telescoping arm system itself, as shown in FIG. 3. These are rotation angle sensors 8 and length sensors 9. The rotation angle sensors 8 detect the alignment of each of the ball-and-socket joints. The length sensors 9 detect the length of the telescoping rods 4. The position of the coils 5 relative to the bed table 1 can be determined from these data and the location of the contact point 2.

It is advantageous for the sensors in the telescoping arm system to be designed so that they do not affect the measurement and are also themselves not magnetically affected. For example, optical systems that operate based on glass or plastic fibers, for example, are suitable for this. The evaluation electronics for the sensors are advantageously located outside of the MR measurement space. An arrangement at the contact point 2 (thus in the base region of the telescoping arm system) is suitable for this purpose, for example. The evaluation electronics receive the data for the position of the contact point 2 at which the telescoping arm system is attached as well as the data of the length sensor and angle measurement sensor and calculates the position of the coil from these.

The telescoping arm system thus enables a three-dimensional determination of the position by the rotation angle sensors and length sensors as well as the position of the contact point 2. In addition to the bearing in the direction of the axis of symmetry of the measurement tube, the height above the bed table and the lateral offset from the central axis of the bed table can thus also be determined.

Figure 2:
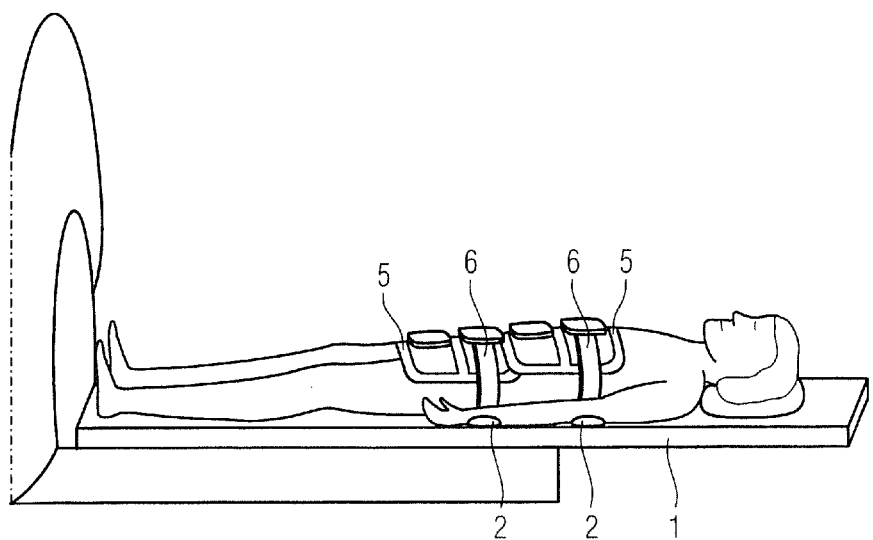
FIG. 2 shows a design for position determination of non-stationary coils by means of flexible belts.

A simpler realization that allows the determination of the position with regard to the bearing in the direction of the axis of symmetry of the measurement tube is shown as a second exemplary embodiment in FIG. 2. In this case the coil 5 is fastened via a fixing belt. The fixing belt 6 is fastened on the one side with the coil 5 and on the other side is attached at an attachment space 2 on the bed table 1. The attachment position on the bed table is in turn determined by capacitive or optical proximity sensors, for example. Since the position of the attachment space in this exemplary embodiment is established at the edge of the bed table 1, here only the position along the longitudinal axis of the bed table 1—i.e. along the axis of symmetry of the measurement tube—is established.

Although modifications and changes may be suggested by those skilled in the art, it is the intention of the inventors to embody within the patent warranted hereon all changes and modifications as reasonably and properly come within the scope of their contribution to the art.

We claim as our invention:

1. A patient table for a magnetic resonance tomography apparatus, comprising:
   a patient platform configured to receive a patient thereon, said patient platform comprising a plurality of side edges;
   a fastener having a first end configured to hold a magnetic resonance local coil at a position relative to the patient on the table platform, and having an opposite end configured for attachment to one of said side edges of said patient platform; and
   a position detector incorporated in said fastener configured to emit a signal that identifies a position of said fastener at said side edge, said position detector comprising a plurality of sensors that generate information from which the position of said fastener is identifiable, said sensors being selected from the group consisting of mechanical contact sensors and capacitive proximity switches.

2. A coil arrangement for a magnetic resonance tomography system, comprising:
   a local coil configured to at least receive magnetic resonance signals from an examination subject;
   a fastener having a first end connected to said coil, and a second end configured for attachment, at a fastening point, to a patient table on which the examination subject is located, said fastener comprising telescoping fastener elements; and
   a position detector incorporated in said fastener, said position detector being configured to emit a signal identifying a position of said coil relative to said fastening point in at least one spatial direction.

3. A coil arrangement as claimed in claim 2 wherein said fastener comprises a plurality of fastener elements interconnected for relative articulation between the fastener elements by articulations selected from the group consisting of pivot bearings and ball-and-socket bearings.

4. A coil arrangement as claimed in claim 3 wherein said position detector comprises a plurality of sensors respectively located at each articulation, each sensor detecting, and emitting a signal corresponding to, an angle between the fastening elements at the articulation at which the sensor is located.

5. A coil arrangement as claimed in claim 2 wherein said fastener is comprised of non-magnetically interacting material.

6. A coil arrangement as claimed in claim 2 wherein said position detector comprises at least one optical sensor that emits an optical sensor signal, and at least one optical waveguide in optical communication with said optical sensor, which conducts said optical sensor signal from said optical sensor.

7. A bed table system comprising:
   a patient table having a patient platform configured to receive an examination subject thereon, said patient platform comprising a plurality of edges;

a local coil configured to at least receive magnetic resonant signals from the examination subject on the patient platform;

a fastener having a first end connected to said local coil and a second end fastened, at a fastening point, to one of said edges of said patient platform; and a position detector incorporated in said fastener, said position detector being configured to determine a position of said fastening point of said fastener at said edge of said patient platform and, from said position of said fastening point, to determine a position of said local coil relative to said fastening point.

8. A method to determine a position of a local coil in a magnetic resonance tomography apparatus comprising the steps of:

placing a local coil at a coil position relative to an examination subject on a patient table, said patient table comprising a plurality of table edges;

fastening said local coil to said patient table with a fastener having a first end connected to the local coil and a second end fastened, at a fastening point, to one of said edges of said patient table;

incorporating a position detector in said fastener; and with said position detector, automatically detecting a position of said fastening point at said one of said edges of said patient table and, from said position of said fastening point, automatically determining said coil position relative to said fastening point and, from said coil position relative to said fastening point, automatically determining a position of said coil relative to said patient table.

9. A patient table and coil position identification system for a magnetic resonance apparatus, comprising:

a patient table having a patient platform, configured to receive an examination subject thereon, said patient platform comprising a plurality of edges;

a local coil configured to at least receive magnetic resonance signals from the examination subject on the patient platform;

a telescoping arm assembly comprising at least one telescoping arm having first and second ends opposite to each other, a fastener element configured to be fastened at a selectable fastening point along one of said edges of said patient table;

a first articulated joint connecting said first end of said telescoping arm to said fastening element, and a second articulate joint connecting said second end of said telescoping arm to said local coil, said first and second articulate joints and said telescoping arm, in combination, allowing selected, three-dimensional positioning of said local coil at a local coil position relative to said examination subject on said patient table;

a fastening element position detector that detects a position of said fastening point along said edge of said patient table;

a plurality of sensors built into said telescoping arm assembly that respectively emit sensor signals that collectively identify said coil position relative to said fastening point; and an evaluation unit in communication with said fastening element position detector and said plurality of sensors built into said telescoping arm assembly so as to receive respective signals therefrom, said evaluation unit being configured to identify a position of said local coil relative to said patient table from said position of said local coil relative to said fastening point, and said position of the fastening point relative to said patient table.

10. A system as claimed in claim 9 wherein said plurality of sensors built into said telescoping arm assembly comprise a first rotation angle sensor built into said first articulated joint, a second rotation angle sensor built into said second articulated joint, and a length sensor built into said at least one telescoping arm.

11. A system as claimed in claim 9 wherein said plurality of sensors built into said telescoping arm assembly are sensors selected from the group consisting of optical sensors and electrical sensors.

12. A system as claimed in claim 9 wherein said fastening element position detector is a proximity sensor.

13. A system as claimed in claim 12 wherein said proximity sensor is a capacitive proximity sensor.

14. A system as claimed in claim 9 wherein said fastening element position detector is a mechanical contact sensor.

15. A system as claimed in claim 9 wherein said fastening element is comprised of non-magnetically interacting material.

* * * * *